(12) United States Patent
Takeda

(10) Patent No.: US 9,515,237 B2
(45) Date of Patent: Dec. 6, 2016

(54) METHOD FOR PRODUCING A LIGHT EMITTING DEVICE

(71) Applicant: NICHIA CORPORATION, Anan-shi, Tokushima (JP)

(72) Inventor: Hideaki Takeda, Kawasaki (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/078,566

(22) Filed: Mar. 23, 2016

(65) Prior Publication Data

US 2016/0284952 A1 Sep. 29, 2016

(30) Foreign Application Priority Data

Mar. 27, 2015 (JP) .................................. 2015-065533

(51) Int. Cl.
*H01L 21/00* (2006.01)
*H01L 33/56* (2010.01)

(52) U.S. Cl.
CPC ......... *H01L 33/56* (2013.01); *H01L 2933/005* (2013.01); *H01L 2933/0033* (2013.01)

(58) Field of Classification Search
CPC ..................................................... H01L 33/56
See application file for complete search history.

(56) References Cited

U.S. PATENT DOCUMENTS 7,163,843 B2 * 1/2007 Kiendl ................. H01L 21/561
438/114
9,391,050 B2 * 7/2016 Imazu ................. H01L 25/0756

FOREIGN PATENT DOCUMENTS

| JP | H05/021523 A | 1/1993 |
| JP | H10-284515 A | 10/1998 |
| JP | 2010-205775 A | 9/2010 |
| JP | 2013-093491 A | 5/2013 |
| WO | WO-2014/061204 A1 | 4/2014 |

* cited by examiner

*Primary Examiner* — Richard Booth
(74) *Attorney, Agent, or Firm* — Foley & Lardner LLP

(57) ABSTRACT

A method for producing a light emitting device includes a first bonding step including disposing a first bonding member a mounting substrate, placing a light emitting element on the mounting substrate such that the first bonding member is located between a mounting face of the light emitting element and the mounting substrate, and hardening the first bonding member thereby bonding the light emitting element and the mounting substrate such that, in a plan view, an entirety of the first bonding member is contained within an area of the mounting face of the light emitting element; and a second bonding step including disposing a second bonding member on the upper face of the mounting substrate such that, in a plan view, the second bonding member is located at at least a portion of an outer edge of the mounting face of the light emitting element, and hardening the second bonding member.

13 Claims, 10 Drawing Sheets

METHOD FOR PRODUCING A LIGHT EMITTING DEVICE

CROSS-REFERENCE TO RELATED APPLICATIONS

The present application claims priority under 35 U.S.C. §119 to Japanese Patent Application No. 2015-065533, filed Mar. 27, 2015, the contents of which are incorporated herein by reference in their entirety.

BACKGROUND

The present disclosure relates to a method for producing a light emitting device.

When a semiconductor light emitting element, such as an LED (light emitting diode), is mounted on a mounting substrate, the light emitting element and the mounting substrate are bonded together using a die bonding material, such as a resin or solder. For example, Japanese Unexamined Patent Application Publication No. 2010-205775 (Patent Document 1) discloses light emitting elements mounted by using a die bonding resin as a die bonding material. More specifically, in cases where a liquid or paste die bonding resin containing a thermosetting resin is employed as a die bonding material, light emitting elements are bonded to a mounting substrate by applying the die bonding resin on the mounting substrate, followed by placing the light emitting elements on the mounting substrate, and curing the die bonding material.

When a solder paste is employed as a die bonding material, light emitting elements are bonded to a mounting substrate by applying the solder paste on the mounting substrate, followed by placing the light emitting elements on the mounting substrate, melting the solder by heating using a reflow furnace, and solidifying the molten solder by cooling.

SUMMARY

The method for producing a light emitting device according to one embodiment is for producing a light emitting device, which includes a mounting substrate and a light emitting element bonded to the mounting substrate and having electrodes on its upper face. The method includes a first bonding step of placing a first bonding material in a liquid or paste form on the upper face of the mounting substrate, placing the light emitting element so that its mounting face opposes the mounting substrate via the first bonding material, and hardening said first bonding material thereby bonding together the light emitting element and the mounting substrate so that the first bonding material is disposed in the area contained within the mounting face of the light emitting element in a plan view; and a second bonding step of placing a second bonding material in a liquid or paste form on the upper face of the mounting substrate at least in one section of the outer edge of the mounting face of light emitting element in a plan view, and hardening the second bonding material.

DESCRIPTION

Figure 1:
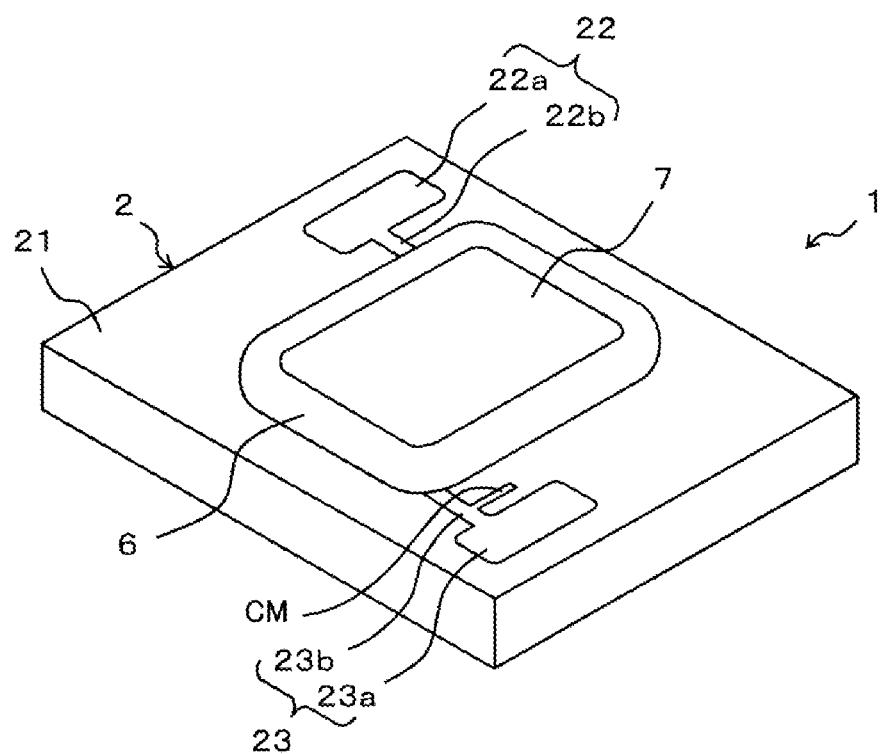
FIG. 1 is a schematic perspective view of the light emitting device construction according to one embodiment.

An embodiment of the invention will be described below with reference to the drawings. The following embodiment, however, exemplify method of producing a light emitting device and a light emitting device for the purpose of embodying the technical concepts of the invention, and do not limit the invention. The dimensions, materials, and shapes of the constituent elements, as well as the relative positioning thereof, described in the embodiment are offered to merely as examples, and are not intended to limit the scope of the invention to those described unless otherwise specifically noted. The sizes of the components, their positional relationship, or the like, shown in the drawings might be exaggerated for clarity of explanations. In the explanations given below, moreover, the same designations and reference numerals indicate the components that are identical or of the same nature, for which the explanations will be omitted when appropriate.

In conventional processes, such as that disclosed in Patent Document 1, however, the light emitting elements are floating atop the liquid die bonding resin before curing, or on the molten solder, during the mounting process. For this reason, the positions of the light emitting elements might occasionally shift within the range where the die bonding material is applied before the die bonding material is hardened. Moreover, in order for the light emitting elements to be securely joined with the mounting substrate, it is preferable to apply the die bonding material in wider areas than the mounting faces of the light emitting elements. However, the range of movement of the light emitting elements is increased as the amount of the die bonding material is increased.

As such, when using a die bonding material during mounting in the conventional processes, it was difficult to bond the light emitting elements by positioning them with high precision. Moreover, when the light emitting elements were arranged at narrow intervals in high density, the die bonding material ended up being continuously disposed over a wide range. This made it even more difficult to bond the light emitting elements with high positional accuracy.

An object of certain embodiments of the present invention is to provide a method for producing a light emitting device having light emitting elements bonded to the mounting substrate that is capable of high precision positioning when bonding the light emitting elements to the mounting substrate.

According to the method for producing a light emitting device according to one embodiment, a light emitting element is bonded to the mounting substrate using a first bonding material disposed in the area contained within the mounting face of the light emitting element in a plan view, followed by bonding the outer edge of the mounting face of light emitting element to the mounting substrate using a second bonding material. Thus, the light emitting element can be bonded to the mounting substrate with high positional accuracy.

Embodiment 1

Structure of Light Emitting Device

A structure of the light emitting device according to an embodiment will be explained with reference to FIGS. 1, 2A, and 2B. For the sake of convenience, an outer shapes of a light reflector 6 and a sealing member 7 are indicated by a two-dot chain line and dashed line, respectively, in the plan view shown in FIG. 2A to allow the interior to be viewed. In FIG. 2B, moreover, the detailed structure of a light emitting element 1 is omitted, but it has an n-side electrode 13 and a p-side electrode 14 on an upper face side, and a substrate 11 on the lower face side. The same is true for the light emitting elements 1 shown in FIGS. 5B to 6B and 8A to 8C discussed later.

A light emitting device 100 is constructed with plural light emitting elements 1 arranged in an array and mounted on a mounting substrate 2. In this embodiment, more specifically, 18 light emitting elements 1 are arranged in 6 rows and 3 columns. The light emitting elements 1 are individually bonded to an upper face of the mounting substrate 2 using bonding member 3 comprising a first bonding member 31 and a second bonding member 32. On the upper face of the mounting substrate 2, a wiring pattern comprising a positive electrode 22, a negative electrode 23, and a relay wiring section 24 is disposed so as to surround a region in which the light emitting elements 1 are arranged. The light emitting elements 1 are electrically connected to one another, and to the wiring pattern, using wires 4 so that the light emitting elements 1 emit light when an external power supply is connected to the positive electrode 22 and the negative electrode 23. Moreover, a protective element 5 is provided between the positive electrode 22 and the negative electrode 23. A light reflector 6 is disposed so as to surround the region in which the light emitting elements 1 are arranged, and the region surrounded by the light reflector 6 is filled with a sealing member 7 to seal the light emitting elements 1 and wires 4.

Neither an outer shape of the mounting substrate 2 nor an outer shape of the array of the light emitting elements 1 is limited to a rectangle, and it can suitably be a circular or polygonal shape. The light emitting elements 1 may be arranged in a two-dimensional array, and may be disposed in a one-dimensional array, or may be a single piece.

Each constituent element will be sequentially explained in greater detail below.

The light emitting elements 1 in this embodiment each has a pair of electrodes, n-side electrode 13 and p-side electrode 14, on its upper face, and its lower face is bonded to the upper face of a mounting substrate 2 using a first bonding member 31 and a second bonding, member 32.

Figure 2A:
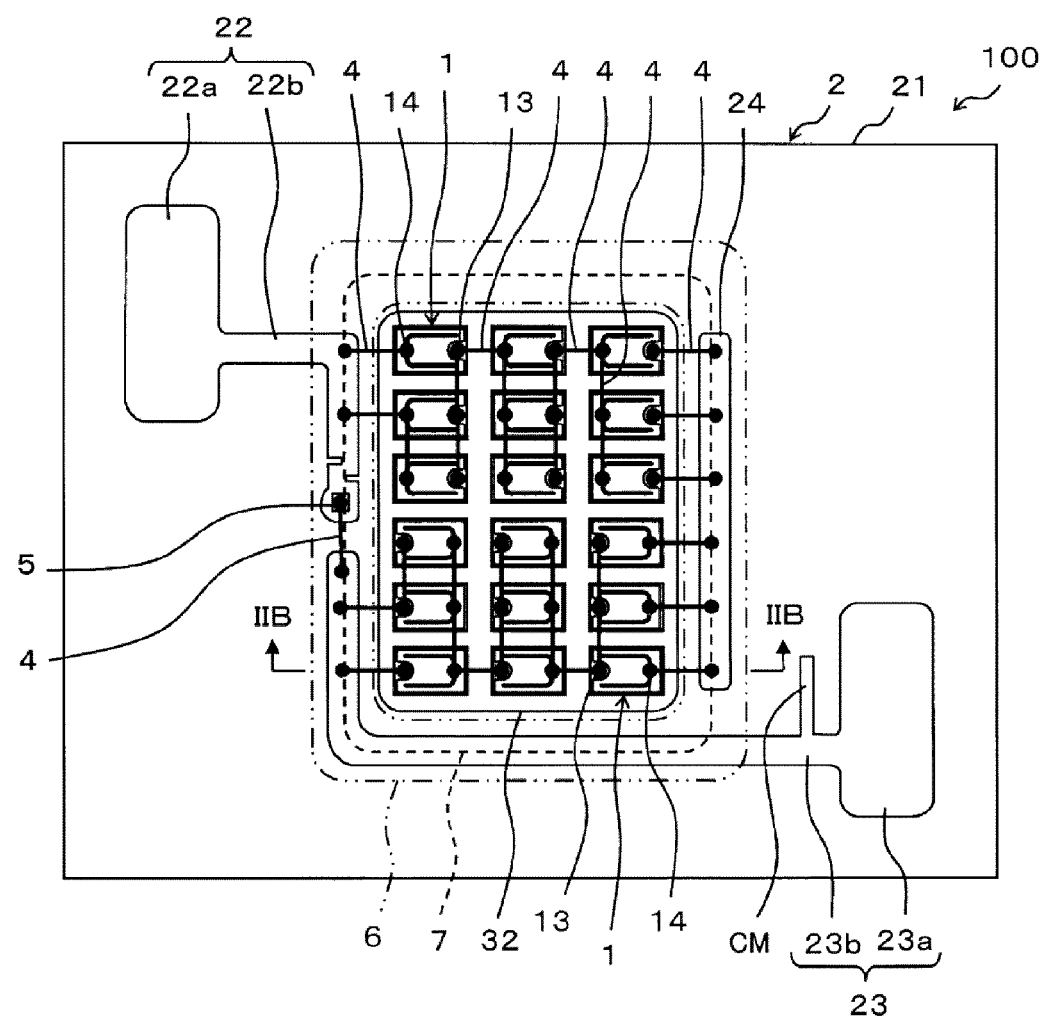
FIG. 2A is a schematic plan view of the light emitting device construction according to the embodiment.
Figure 2B:
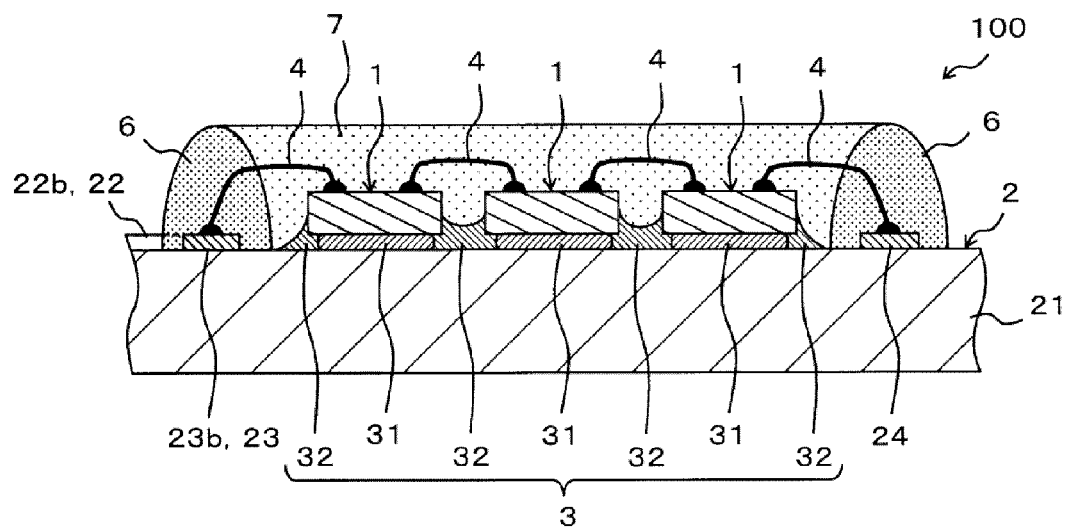
FIG. 2B is a schematic sectional view of the light emitting device construction according to the embodiment along line IIB-IIB indicated in FIG. 2A.

In this embodiment, as shown in FIG. 2A, the light emitting elements 1 arranged in the upper three rows are oriented to have the n-side electrodes 13 on the right hand side and the p-side electrodes 14 on the left hand side, whereas the light emitting elements 1 arranged in the lower three rows are oriented to have the n-side electrodes 13 on the left hand side and the p-side electrodes 14 on the right hand side. The three light emitting elements 1 in each row of the upper three rows are connected in series in the row-wise (horizontal) direction between the wiring section 22b of the positive electrode 22 and the relay wiring section 24 by wires 4. The three light emitting elements 1 in each column of the upper three rows are connected in parallel. The three light emitting elements 1 in each row of the lower three rows are connected in series in the row-wise (horizontal) direction between the wiring section 23b of the negative electrode 23 and the relay wiring section 24 by wires 4. The three light emitting elements 1 in each column of the three lower rows are connected in parallel. Accordingly, the 18 light emitting elements 1 are connected to be equivalent to a circuit where three serially connected sets, each set having six serially connected light emitting elements 1, are connected to the positive electrode 22 and the negative electrode 23 in parallel.

Here, an example of the construction of the light emitting element 1 will be explained with reference to FIGS. 3A and 3B.

For the light emitting elements 1 in this embodiment, semiconductor light emitting elements, such as LEDs, can suitably be used. The light emitting elements 1 in this embodiment are each formed in a rectangle in a plan view, and include a substrate 11, a semiconductor stack 12, an n-side electrode 13, a p-side electrode 14, and a protective film 15, respectively. The light emitting elements 1 in this embodiment each has the semiconductor stack 12 having an LED (light emitting diode) structure on one principal face of the substrate 11, and further has the n-side electrode 13 and p-side electrode 14 on the surface of the semiconductor stack 12, thereby being suitable for the mounting method using the upper face side of the light emitting element as the emission face.

The substrate 11 is a component that supports the semiconductor stack 12. Example materials that can be employed include sapphire, SiC, or the like. The substrate 11 may also be, for example, a substrate enabling epitaxial growth of the semiconductor stack 12. In the case of forming the semiconductor stack 12 using a nitride semiconductor, such as GaN (gallium nitride), for example, sapphire can suitably be used.

The semiconductor stack 12 is constructed by stacking on one principal face (the upper face) of the substrate 11 an n-type semiconductor layer 12n, an active layer 12a, and a p-type semiconductor layer 12p so as to emit light when an electrical current is supplied between the n-side electrode 13 and the p-side electrode 14.

The semiconductor stack 12 has a region where the p-type semiconductor layer 12p and the active layer 12a are absent, i.e., the region 12b where the n-type semiconductor layer 12n is exposed. The n-side electrode 13 is disposed in the region 12b where the n-type semiconductor layer 12n is exposed, and is electrically connected to the n-type semiconductor layer 12n.

A light transmitting electrode 141 is disposed substantially across the entire upper face of the p-type semiconductor layer 12p, and a pad electrode 142 is further disposed in one section of the upper face of the light transmitting electrode 141.

The n-side electrode 13 is a negative polarity side pad electrode for supplying electrical current to the light emitting element 1 from the outside. For the n-side electrode 13, Cu, Au, or an alloy having either metal as its main component, for example, can be used so as to be suitable for external connection by wire bonding, or the like.

The p-side electrode 14 is disposed on the upper face of the p-type semiconductor layer 12p to be electrically connected to the p-type semiconductor layer 12p, and is a positive polarity side electrode for supplying electrical current from the outside. The p-side electrode 14 has a structure where a light transmitting electrode 141 and a pad electrode 142 are stacked.

The light transmitting electrode 141 located on the lower side of the p-side electrode 14 is disposed so as to cover substantially the entire upper face of the p-type semiconductor layer 12p. The light transmitting electrode 141 functions as an electrical current diffusion layer for diffusing the electrical current supplied from the outside via the pad electrode 142 to substantially the entire surface of the p-type semiconductor layer 12p. The light transmitting electrode 141 can be formed with a conductive metal oxide. For example, ITO (Sn-doped $In_2O_3$), which is a high conductivity material having high light transmittance with respect to the visible light (in the visible range), can suitably be used.

The pad electrode 142 located on the upper side of the p-side electrode 14 is disposed in one section of the upper face of the light transmitting electrode 141, and is a layer for external connection. As shown in FIG. 3A, the pad electrode 142 comprises an external connection section 142a for enabling external connection by wire bonding, or the like, and an extended section 142b which extends from the external connection section 142a for more efficient diffusion of the electrical current. For the pad electrode 142, as in the case of the n-side electrode 13, Cu, Au, or an alloy having either metal as its main component, for example, can be used so as to be suitable for external connection by wire bonding, or the like.

The protective film 15 has light transmittance and insulating properties, and is a film that covers substantially entirely the upper and a portion of side faces of the light emitting element 1, excluding side faces and a bottom faces of the substrate 11. The protective film 15 also has openings 15n and 15p on the upper faces of the n-side electrode 13 and the pad electrode 142, respectively, which are the regions for external connection. For the protective film 15, for example, an oxide, such as $SiO_2$, $TiO_2$, $Al_2O_3$, or the like, a nitride such as SiN or the like, or a fluoride such as $MgF_2$ or the like, can suitably be used.

In the light emitting element 1, moreover, the positions and shapes of the n-side electrode 13 and p-side electrode 14, and the stacking structure are not limited to those employed in this embodiment, and can be suitably determined.

The light emitting element 1 is not limited to those having both the n-side electrode 13 and the p-side electrode 14 on one face like this embodiment, and it may have the n-side electrode 13 on one face and the p-side electrode 14 on the other face. In this case, for the first bonding member 31, a conductive bonding material, for example, metal such as solder, an anisotropic conductive paste made of a thermosetting resin containing conductive particles, or the like, can be used to electrically connect one of the electrodes disposed on the mounting face side of the light emitting element 1 to the wiring pattern disposed on the upper face of the mounting substrate 2. The other electrode disposed on the opposing face of the light emitting element 1 can be electrically connected to the wiring pattern by wire bonding.

The surface of the light emitting element 1 to be joined with a bonding member 3 preferably allows for the bonding member 3 to effect good wetting. For example, in the cases where the bonding member 3 is a metal material, such as solder, to be joined to the lower face of the light emitting element 1, the lower face of the light emitting element 1 preferably has a metal film which has Au or Sn as the outermost surface. When the first bonding member 31 is metal such as solder, in particular, disposing a metal film in one section of the lower face of the light emitting element 1 can bond the light emitting element 1 and the first bonding material 31 at the section where the metal film is formed. Moreover, disposing the metal film inward from the perimeter of the light emitting element 1 being surrounded by a material with which the first bonding member 31 has poor wetting (for example, sapphire) can reduce adhering the first bonding member 31 to the outer edge of the light emitting element. By bonding the light emitting element using the second bonding member 32 primarily made of a thermosetting resin at the outer region where the first bonding material 31 hardly adheres to, the light emitting device 100 according to this embodiment can be easily produced.

Returning to FIGS. 1, 2A and 2B, the explanation of the construction of the light emitting device 100 will be continued.

The mounting substrate 2 in this embodiment is a substrate for mounting electronic components such as the light emitting elements 1, and includes a rectangular flat sheet shaped base 21, and a wiring pattern disposed on an upper face of the base 21 comprising a positive electrode 22, a negative electrode 23, and a relay wiring section 24.

It is preferable to use an insulating material for the base 21, and is preferable to use a material which does not allow the light emitted from the light emitting elements 1 or the external light to transmit therethrough. It is also preferable to use a material having strength to some extent. Examples include ceramics (Al$_2$O$_3$, AlN, or the like), and resins, such as phenol resins, epoxy resins, polyimide resins, BT resin (bismaleimide triazine resin), polyphthalamide (PPA), or the like. The upper face of the base 21, at least a region where the light emitting elements 1 are mounted, preferably have good light reflectivity. It is preferable to dispose a light reflecting layer employing, for example, metal, such as Ag, Al, or the like, or a white resin containing white pigments.

The positive electrode 22 has a pad section 22a for connecting to an external power supply, and a wiring section 22b for wire connecting with the light emitting elements 1 and the protective element 5. The wiring section 22b is disposed so as to extend from the pad section 22a provided at the upper left region, and along the left side of the rectangular region in which the light emitting elements 1 are arranged.

The negative electrode 23 has a pad section 23a for connecting to an external power supply, and a wiring section 23b for wire connecting with the light emitting elements 1 and the protection element 5. In the vicinity of the wiring section 23b, a cathode marking CM is provided to identify the negative electrode. The wiring section 23b is disposed so as to extend from the pad section 23a provided at the lower right region, and along the lower side and the left side of the rectangular region in which the light emitting elements 1 are arranged.

The relay wiring section 24 is provided to relay the wiring between the positive electrode 22 and the negative electrode 23, and is disposed so as to extend along the right side of the rectangular region in which the light emitting elements 1 are arranged.

The wiring section 22b, the wiring section 23b, and the relay wiring section 24 are electrically connected to the light emitting elements 1 using wires 4 as described above. The protective element 5 is mechanically and electrically connected to one end of the wiring section 22b using a conductive bonding member such as solder, and electrically connected to the wiring section 23b using a wire 4. For the wiring pattern comprising the positive electrode 22, the negative electrode 23, and the relay wiring section 24, a metal film made of, for example, Cu, Au, Ag, Al, or the like, can be used.

The positive electrode 22, the negative electrode 23, and the relay wiring section 24 are not limited to those exemplified in FIG. 2A, and the wiring pattern can be suitably determined in accordance with the manner in which the light emitting elements 1 are arranged or electrically connected.

In this embodiment, the light emitting elements 1 are bonded on the base 21, but are not limited to this. For example, they may be mounted on the positive electrode 22, the negative electrode 23, the relay wiring section 24, or any other metal material disposed on the base 21. The mounting substrate 2 in this embodiment is constructed with conductive electrodes disposed on the upper face of the insulating base 21, but is not limited to this. The mounting substrate 2 may be one which has no base 21 (i.e., constructed only with electrodes).

Figure 4:
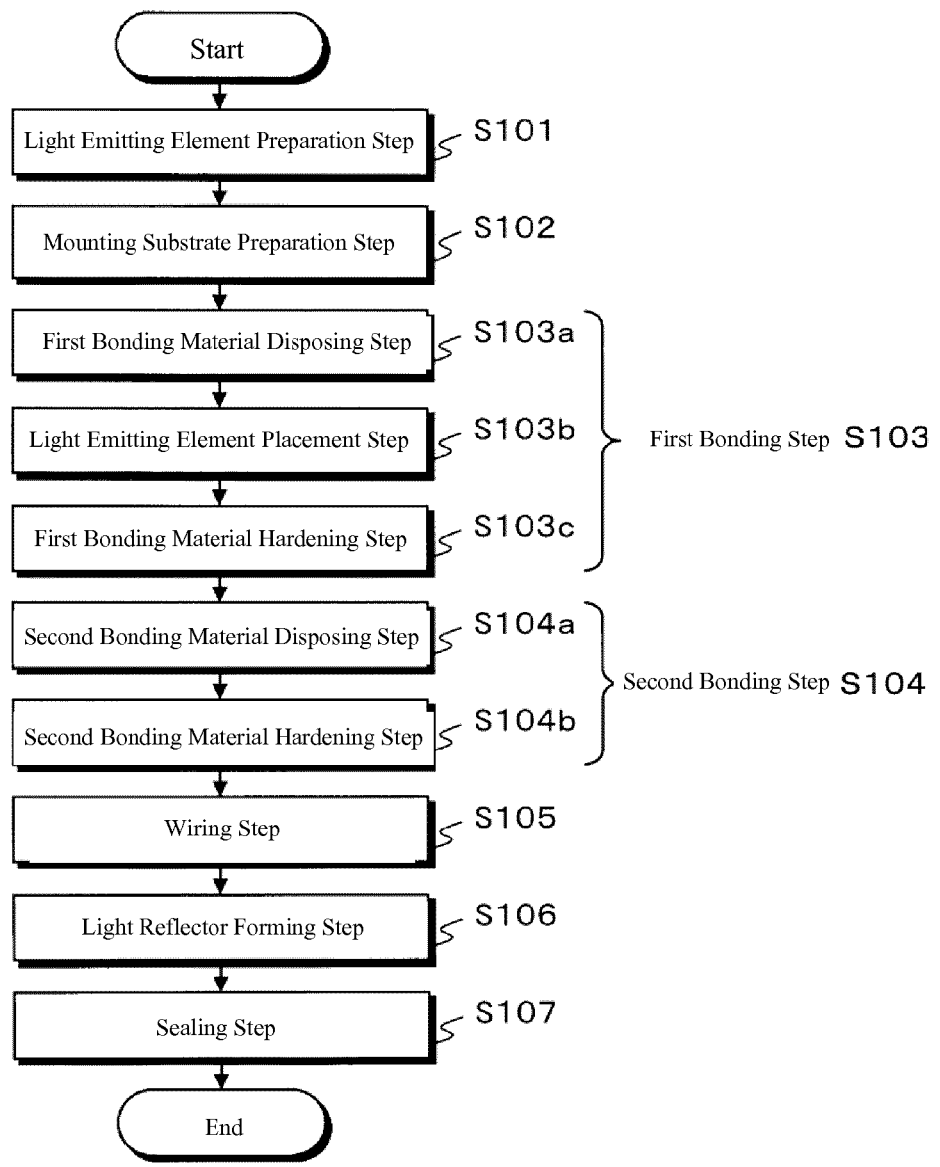
FIG. 4 is a flowchart showing the steps in the method for producing a light emitting device according to the embodiment.

The bonding member 3 provided for bonding the light emitting elements 1 to the upper face of the mounting substrate 2 comprise a first bonding member 31 and a second bonding member 32. In this embodiment, the light emitting elements 1 are bonded to the mounting substrate 2 using the first bonding member 31 so as to be positioned with high precision in the first bonding step S103 (see FIG. 4), and then bonded to the mounting substrate 2 using the second bonding member 32 in the second bonding step S104 (see FIG. 4).

The first bonding member 31 is disposed in an area contained within the lower face of the substrate 11, which is the mounting face of each light emitting element 1, in a plan view. The first bonding member 31 is disposed between the mounting substrate 2 and the light emitting element 1 in a liquid or paste form, and then exerts its bonding strength when hardened by heat treatment or the like. For the first bonding member 31, metals, thermosetting resins, thermosetting resins containing metal particles, or the like, can be suitably used.

Now, in the case where the second bonding member 32 is a material that exerts its bonding strength when hardened by heat treatment, and the first bonding member 31 is of the nature that would melt or remelt, the materials employed as the first and second bonding, members 31 and 32 are selected so that the melting temperature of the first bonding member 31 is higher than the heating temperature for the second bonding member 32.

The second bonding member 32 is disposed at least in one section of the outer edge of the mounting face of each light emitting element 1. The second bonding member 32 can enhance the bonding between the light emitting element 1 and the mounting substrate 2. The second bonding member 32 is disposed at the outer edges of the light emitting element 1 in a liquid or paste form, and then exert its bonding strength when hardened following heat treatment or the like. For the second bonding member 32, metals, thermosetting resins, thermosetting resins containing metal particles, or the like, can suitably be used.

In this embodiment, as shown in FIG. 2B, the second bonding member 32 is disposed contiguously between the light emitting elements 1. However, the configuration of the second bonding member 32 is not limited to this, and can be disposed in isolation per light emitting element 1. In other words, the second bonding member 32 can be disposed under each light emitting element 1 isolated from one another.

The second bonding member 32 preferably bonds each light emitting element 1, for example, in at least 99%, at least 85%, or at least 50% of the lower face area of the light emitting element 1.

Examples of the combinations of the first and second bonding materials 31 and 32 will be explained with reference to TABLE 1. TABLE 1 exemplifies the combinations of materials for the first and second bonding members 31 and 32. The combinations of the first and second bonding members 31 and 32 include those that combine two metals, those that combine metal and a thermosetting resin, those that combine two thermosetting resins, and those that combine a metal-containing thermosetting resin and a thermosetting resin. Moreover, the materials for the first and second bonding members 31 and 32 are selected so that the bonding achieved by the first bonding member 31 can be retained during the heat treatment to harden the second bonding member 32.

TABLE 1

| Combination No. | First Bonding Member | Second Bonding Member | Combination Type |
| --- | --- | --- | --- |
| 1 | AuSn paste (Au 78: Sn 22) | AuSn paste (Au 1: Sn 9) | Metal-Metal |

TABLE 1-continued

| Combination No. | First Bonding Member | Second Bonding Member | Combination Type |
|---|---|---|---|
| 2 | AuSn paste (Au 78: Sn 22) | SnCu paste | |
| 3 | AuSn paste (Au 1: Sn 9) | SnCu paste | |
| 4 | AuSn paste (Au 78: Sn 22) | Silicone resin | Metal-Resin |
| 5 | AuSn paste (Au 1: Sn 9) | Silicone resin | |
| 6 | SnCu paste | Silicone resin | |
| 7 | AuSn paste (Au 78: Sn 22) | Epoxy resin | |
| 8 | AuSn paste (Au 1: Sn 9) | Epoxy resin | |
| 9 | SnCu paste | Epoxy resin | |
| 10 | Silicone resin | Silicone resin | Resin-Resin |
| 11 | Silicone resin | Epoxy resin | |
| 12 | Epoxy resin | Silicone resin | |
| 13 | Epoxy resin | Epoxy resin | |
| 14 | Ag paste | Silicone resin | Metal Resin-Resin |
| 15 | Ag paste | Epoxy resin | |

Combination Nos. 1-3 shown in TABLE 1 combine a first metal for the first bonding member 31 and a second metal for the second bonding member 32, both having a relatively low melting point (for example, about 300° C. or lower), such as solder.

These metals bond together the light emitting elements 1 and the mounting substrate 2 by being cooled to harden (solidify) after being melted by heat treatment. Metals may lose their bonding ability if remelted by being heated above their melting points even after they are once hardened. Accordingly, when combining two metals, selections may be made so that the melting point of the metal selected as the second bonding member 32 (the first temperature) is lower than the melting point of the metal selected as the first bonding member 31 (the second temperature). This enables the heat treatment for the second bonding member 32 to be performed under the temperature condition that allows the first bonding member 31 to retain its bonding ability without remelting.

For the metals employed as the first and second bonding members 31 and 32, for example, AuSn-based low melting point (217° C.) eutectic composition (Au 1:Sn 9) solder, AuSn-based high melting point (278° C.) eutectic composition (Au 78:Sn 22) solder, SnCu-based lead-free solder specified by JIS Z 3283: 2006, or the like, can suitably be used. Here, composition Au 1:Sn 9 represents 10 mass % Au and 90 mass % Sn, and composition Au 78:Sn 22 represents 78 mass % Au and 22 mass % Sn.

When using metal for both the first and second bonding members 31 and 32, the first and second bonding members 31 and 32 in a liquid or paste form before being hardened may be used as the first and second pastes, respectively, by having a solvent, such as a flux, contain particles of the metals described above.

Combination Nos. 4-9 shown in TABLE 1 combine a relatively low melting point (preferably about 300° C. or lower) metal such as solder for the first bonding member 31, and a thermosetting resin for the second bonding member 32.

For the first bonding member 31, the same metals described in connection with the combination Nos. 1-3 can be used. For the second bonding member 32, a thermosetting resin having high light transmission, heat resistance, weather resistance, and light resistance is preferably used. Examples of such thermosetting resins include silicone resins, silicone modified resins, epoxy resins, epoxy modified resins, urea resins, phenol resins, acrylic resins, or hybrid resins containing at least one of these resins. Among all, silicone or epoxy resins are preferable. The curing temperatures for these materials are about 120–180° C.

When combining a metal and a thermosetting resin, moreover, selections may be made so that the curing temperature of the thermosetting resin selected as the second bonding material 32 is lower than the melting point of the metal selected as the first bonding member 31. This enables the curing of the second bonding member 32 to be performed under the temperature condition that allows the first bonding member 31 to retain its bonding ability without remelting.

Combination Nos. 10-13 shown in TABLE 1 combine two thermosetting resins as the first and second bonding members 31 and 32. Thermosetting resins bond together the light emitting elements 1 and the mounting substrate 2 when cured by heat treatment, but once cured, they can retain their bonding ability without remelting even if reheated. Accordingly, the thermosetting resins used as the first and second bonding members 31 and 32 may have the same curing temperature, or either may have a higher curing temperature.

Combination Nos. 14 and 15 shown in TABLE 1 combine a metal paste prepared by having a thermosetting resin contain metal particles having a relatively high melting point (at least higher than the curing temperature of the thermosetting resin) used as the first bonding member 31, and a thermosetting resin used as the second bonding member 32. For the metal, Ag or Cu, for example, can be employed. The bonding ability of the first bonding member 31 is exerted by the curing of the thermosetting resin, but the metal particles contained therein allow the heat to transfer from the light emitting elements 1 to the mounting substrate 2, thereby reducing the temperature increase in the light emitting elements 1. Imparting conductivity to the first bonding member 31 by having it contain metal particles can also achieve electrical connection between the light emitting elements 1 and the mounting substrate 2.

Even when heat treatment is performed to cure the second bonding member 32, the first bonding member 31 can retain its bonding ability because it contains a thermosetting resin. Accordingly, the thermosetting resins combined as the first and second bonding members 31 and 32 may have the same curing temperature, or either may have a higher curing temperature.

For the thermosetting resins for the first and second bonding members 31 and 32, those cited in the combination Nos. 10-13 can be used.

In the cases where one of the electrodes of the light emitting elements 1 is disposed on the mounting face side, the light emitting elements 1 can be mounted on, and electrically connected to, the mounting substrate 2 by being bonded to the electrode of the mounting substrate 2 using a metal, such as solder, or a conductive adhesive material made of a metal-containing thermosetting resin as the first bonding member 31.

In the cases where a light transmitting material, such as an epoxy or silicone resin, is used as the first bonding member 31 and/or the second bonding member 32, the thermosetting resin may contain light reflecting particles. Imparting light reflectivity to the first bonding member 31 and/or the second bonding member 32 by having it contain light reflecting particles can increase the light extraction efficiency from the upper face side of the light emitting elements 1, and as a result, can increase the light extraction efficiency of the light emitting device 100. For the light reflecting particles, a substance having a refractive index that is significantly different from that of the light transmitting base material is preferable, and for example, $TiO_2$, $Al_2O_3$, $ZrO_2$, MgO, or the like, can suitably be used.

The light emitting device 100 in this embodiment includes wires 4. The wires 4 are used to electrically connect the light emitting elements 1 with one another, and between the light emitting elements 1 and the wiring sections 22b, 23b, and the relay wiring section 24. The wire 4 is also used to electrically connect a protective element 5 to the wiring section 23b. For the wires 4, metal wires having good conductivity, such as Cu, Au, Ag, Al, or any alloy having these metals as the main components can suitably be used.

The light emitting device 100 in this embodiment includes a protective element 5. The protective element 5 is disposed for the purpose of protecting the light emitting elements 1 from electrostatic discharge, for example. For the protective element 5, for example, a Zener diode connected to the light emitting elements 1 in reverse polarity between the positive electrode 22 and the negative electrode 23 can be used. A varistor, resistor, capacitor, or the like, can also be used as the protective element 5.

One of the electrodes of the protective element 5 in this embodiment is electrically connected to the wiring section 22b by being joined thereon using a conductive bonding material such as solder. The other electrode of the protective element 5 is electrically connected to the wiring section 23b using a wire 4.

The light emitting device 100 in this embodiment includes a light reflector 6. The light reflector 6 is formed to cover the relay wiring section 24, the protective element 5, a portion of each of the wiring sections 22b and 23b, and a portion of each of the wires 4 connecting these. With this arrangement, even when the wiring sections 22b and 23b, the relay wiring section 24 and the wires 4 are formed using Au which readily absorbs light, the light emitted from the light emitting elements 1 is reflected by the light reflector 6 and an amount of light reaching the wiring sections 22b and 23b, the relay wiring section 24, or the wires 4 can be reduced. Accordingly, loss of emitted light can be reduced, and the light extraction efficiency of the light emitting device 100 can be increased. Furthermore, covering the relay wiring section 24, the protection element 5, a portion of each of the wiring sections 22b and 23b, and a portion of each of the wires 4 connecting these with the light reflector 6 can protect these components from dust, moisture, external force, or the like.

The light reflector 6 is preferably formed on the mounting substrate 2 in a quadrangle frame shape so as to surround the region in which the light emitting elements 1 are arranged. The light reflector 6 formed to surround the region in which the light emitting elements 1 are arranged in this manner can upwardly reflect the light emitted transversely from the light emitting elements 1 located at the top, bottom, right, and left ends shown in FIG. 2A and travels towards the periphery of the region in which the light emitting elements 1 are arranged. This can reduce loss of emitted light, and thus can increase the light extraction efficiency of the light emitting device 100.

For the light reflector 6, a resin material having good transmittance and insulation properties, such as an epoxy or silicone resin, for example, can suitably be used. Light reflectivity can be preferably imparted by dispersing in the base resin material light reflecting particles, such as $TiO_2$, $Al_2O_3$, $ZrO_2$, or MgO, for example.

The light emitting device 100 in this embodiment includes a sealing member 7. The sealing member 7 is disposed to fill the recess, which is a region surrounded by the light reflector 6, to protect the light emitting elements 1, the protection element 5, and the wires 4 from dust, moisture, external force, or the like.

For the sealing member 7, materials having good light transmission, weather resistance, and light resistance are preferable, and for example, silicone resins, epoxy resins, urea resins, or the like can suitably be used. These resin materials, moreover, may appropriately contain a wavelength converting substance (phosphor), a coloring agent, a light diffusing material, and any other filler. The sealing member 7 may also be heaped up to a bullet or convex lens shape so that the sealing member 7 can function as a lens.

Operation of the Light Emitting Device

Next, the operation of the light emitting device 100 in this embodiment will be explained with reference to FIGS. 2A to 3.

The light emitting elements 1 emit light when power is supplied via the wires 4 and the relay wiring section 24 from an external power supply which connected to the positive electrode 22 and the negative electrode 23 of the mounting substrate 2. The light emitted upwardly from the light emitting elements 1 is extracted from the upper face through the sealing member 7. The light emitted transversely from the light emitting elements 1 is reflected by the side faces of the light reflector 6, and is extracted from the upper face through the sealing member 7. The light emitted downwardly from the light emitting elements 1 is reflected by the first bonding member 31, the second bonding member 32, or the base 21, and is extracted from the upper face through the sealing member 7.

Since each light emitting element 1 is precisely positioned and bonded by the first bonding member 31 on the mounting substrate 2, the light emitting device 100 can achieve good light distribution characteristics.

Method for Producing the Light Emitting Device

The method for producing the light emitting device according to this embodiment will be explained next with reference to FIGS. 4 to 8C. The method for producing the light emitting device according to this embodiment includes a light emitting element preparation step S101, a mounting substrate preparation step S102, a first bonding step S103, a second bonding step S104, a wiring step S105, a light reflector forming step S106, and a sealing step S107.

The first bonding step S103 includes a first bonding member disposing step S103a, a light emitting element placement step S103b, and a first bonding member hardening step S103c. The Second bonding step S104 includes a second bonding member disposing step S104a and a second bonding member hardening step S104b.

Figure 3A:
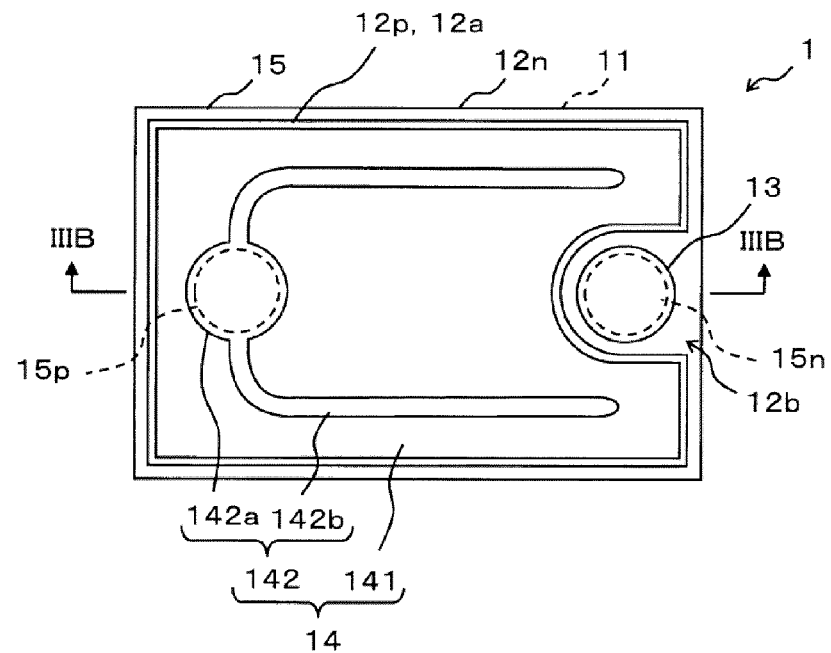
FIG. 3A is a schematic plan view of the light emitting element construction employed in the light emitting device according to the embodiment.
Figure 3B:
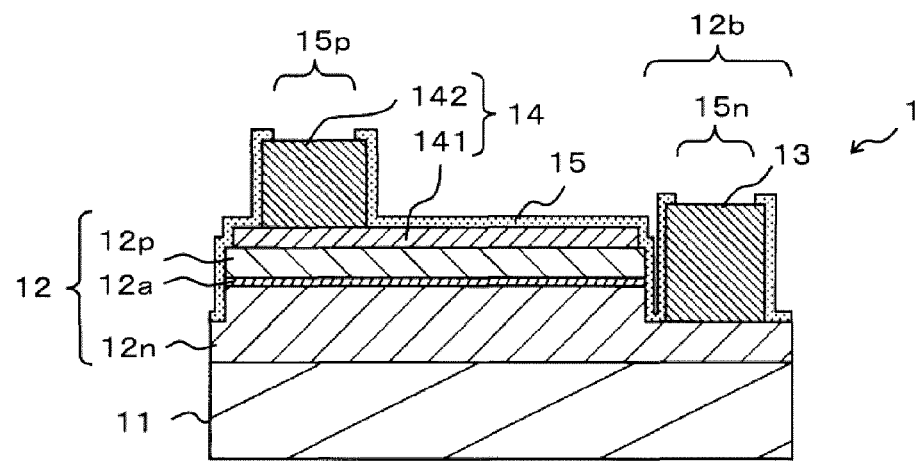
FIG. 3B is a schematic sectional view of the light emitting element construction employed in the light emitting device according to the embodiment along line IIIB-IIIB indicated in FIG. 3A.

The light emitting element preparation step S101 is a step of preparing light emitting elements 1 having the structure such as that shown in FIGS. 3A and 3B. An example of the production method for the light emitting elements 1 will be explained below.

In more specific terms, first, on the upper face of a substrate 11, such as sapphire, a semiconductor stack 12 is formed by sequentially stacking an n-type semiconductor layer 12n, an active layer 12a, and p-type semiconductor layer 12p using a semiconductor material, such as a nitride semiconductor, by MOCVD or the like. The n-type semiconductor layer 12n is then exposed in one region of the surface of the semiconductor stack 12 by removing from the upper face side the p-type semiconductor layer 12p and the active layer 12a entirely, and the n-type semiconductor layer 12n partially.

Then, a light transmitting electrode 141 is formed using a light transmitting conductive material, such as ITO, so as to cover substantially the entire upper face of the p-type semiconductor layer 12p. A p-side electrode 14 is further formed on one upper face section of the light transmitting electrode 141 by forming a pad electrode 142 using a metal material, such as Cu or Au. On the upper face of the exposed n-type semiconductor layer 12n, an n-side electrode 13 is formed by forming a pad electrode 132 using a metal material, such as Cu or Au.

Next, a protective film 15 covering the entire wafer is formed using a light transmitting insulating material, such as $SiO_2$, so as to have the openings 15n and 15p in the upper face regions of the n-side electrode 13 and the pad electrode 142, respectively, for external connection.

Then, the light emitting elements 1 are separated by cutting the wafer by dicing or scribing. The substrate 11 may be thinned before cutting the wafer by polishing the face on which the semiconductor stack 12 is not formed.

A step of disposing a metal film at the bottom of the substrate 11 to enhance the bondability with a metal material may be included.

The mounting substrate preparation step S102 is a step of preparing the mounting substrate 2 on which the wiring pattern comprising the positive electrode 22, the negative electrode 23, and the relay wiring section 24 is formed. The wiring pattern can be formed by a subtractive process, for example, by forming a metal film across the entire upper face of the base 21, disposing a mask covering the regions to be retained as the wiring pattern, and etching off the exposed metal film.

Either the light emitting element preparation step S101 or the mounting substrate preparation step S102 may precede the other, or the two steps may be performed in parallel. In this specification, the preparation steps are not limited to those that produce the light emitting elements 1 and the mounting substrate 2 by the processes described above, and include obtaining them by purchasing or the like.

The first bonding step S103 is a step of bonding the light emitting elements 1 to the mounting substrate 2 using a first bonding member 31, preferably with good positional accuracy. As described earlier, this step may include three steps.

Figure 5A:
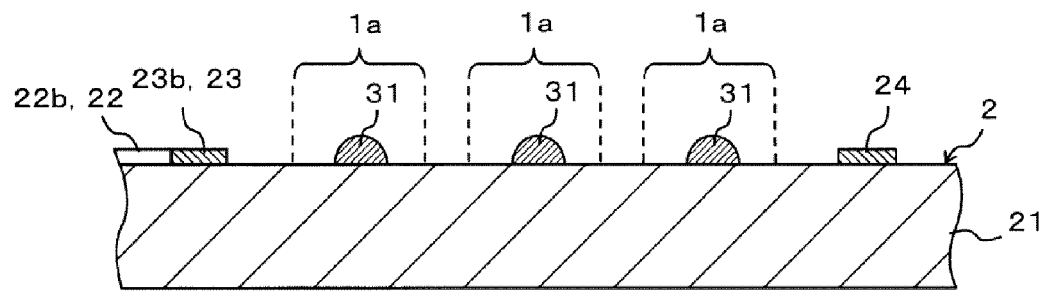
FIG. 5A is a sectional view schematically showing the first bonding material disposing step in the method for producing a light emitting device according to the embodiment.

In the first bonding member disposing step S103a, as shown in FIG. 5A, an appropriate amount of the first bonding member 31 in a liquid or paste form is supplied by a dispensing process, or the like, within the prescribed individual disposition areas 1a on the upper face of the mounting substrate 2 where the light emitting elements 1 will be placed. The appropriate amount in this context means the amount that would not cause the liquid or paste first bonding member 31 to ooze out of the mounting face of each light emitting element 1 when pressed to spread out by placing the light emitting element 1 on the first bonding member 31. Moreover, the first bonding member 31 is supplied in the amount that is sufficient to achieve the bonding strength at which the light emitting elements 1 are not separated from the mounting substrate 2 or dislocated at least until the light emitting elements 1 are firmly bonded in the second bonding step S104. The first bonding member 31 is preferably placed roughly in the center of each light emitting element 1 in a plan view.

Figure 5B:
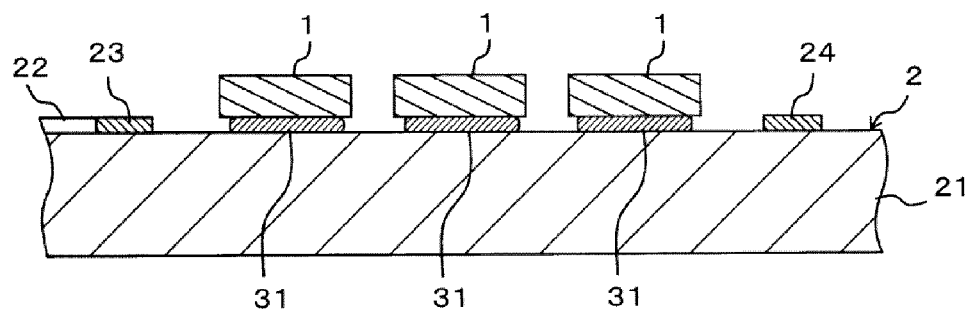
FIG. 5B is a sectional view schematically showing the light emitting element placing step in the method for producing a light emitting device according to the embodiment.

Next, in the light emitting element placement step S103b, as shown in FIG. 5B, the light emitting elements 1 are placed using collets, for example, in the individual disposition areas 1a on the upper face of the mounting substrate 2 via the first bonding member 31.

Figure 5C:
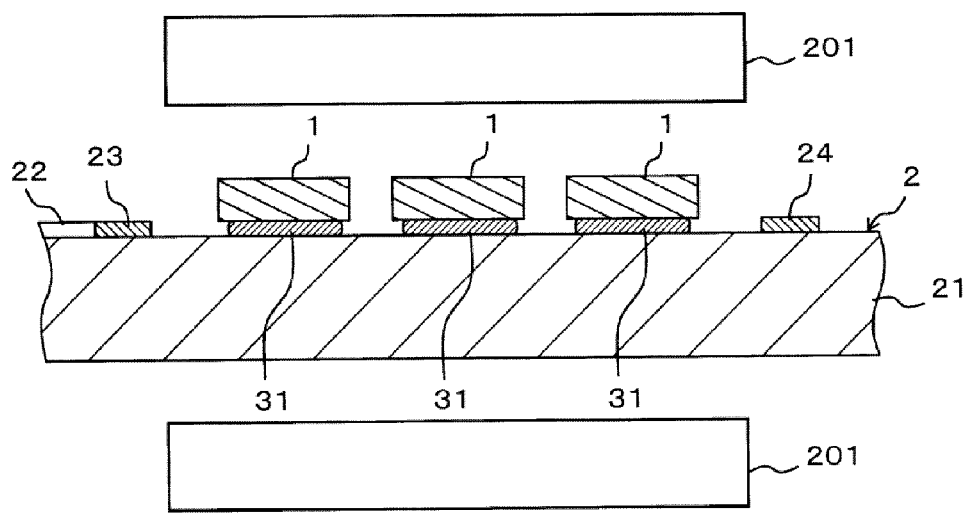
FIG. 5C is a sectional view schematically showing the first bonding material hardening step in the method for producing a light emitting device according to the embodiment.

Then in the first bonding member hardening step S103c, as shown in FIG. 5C, the light emitting elements 1 and the mounting substrate 2 are bonded together by allowing the first bonding member 31 to harden by performing heat treatment using a heating apparatus 201.

In the cases where the first bonding member 31 before hardening is a paste combining a solvent such as a flux and metal particles such as solder, the light emitting elements 1 and the mounting substrate 2 are bonded together when the metal particles are melted by heating to the melting point or higher and subsequently hardened (solidified) by cooling.

Cooling may be accomplished by using a cooling apparatus, or by natural cooling by letting it stand at room temperature or lower.

In the cases where the first bonding member 31 before hardening is a thermosetting resin, or a material containing relatively high melting point metal particles and a thermosetting resin, such as an Ag paste, the first bonding member 31 can be hardened by heating to at least the pre-cure temperature of the thermosetting resin. In other words, the curing of the first bonding member 31 in the first bonding member hardening step S103c is sufficient as long as the light emitting elements 1 and the mounting substrate 2 are joined together, which includes pre-curing.

This step may also be performed under the full cure temperature and heating time conditions to fully cure the first bonding member 31.

A heating apparatus 201 can be appropriately selected in accordance with the type of the first bonding member 31 and the heating temperature required for hardening the material. For example, a reflow furnace, an oven, an infrared heater, a laser heater, a hot air heater, or a sheet heater capable of holding the mounting substrate 2 thereon can be used.

In the first bonding step S103 in this embodiment, the first bonding member 31 is placed in the areas contained within the mounting faces of the light emitting elements 1 in a plan view. The light emitting elements 1 can be positioned with high precision without being significantly dislocated from the prescribed individual disposition areas 1a, even when the first bonding member 31 is in the liquid or paste state before hardening, in the state of reduced viscosity during heat treatment, or in the molten state in the case the first bonding member 31 is a low melting point metal. By hardening the first bonding member 31, the light emitting elements 1 can be bonded to the mounting substrate 2 while being precisely positioned.

The second bonding step S104 is a step of bonding together the outer edges of the light emitting element 1 and the mounting substrate 2 using the second bonding member 32 subsequent to the first bonding step S103. As described earlier, this step includes two steps.

Figure 6A:
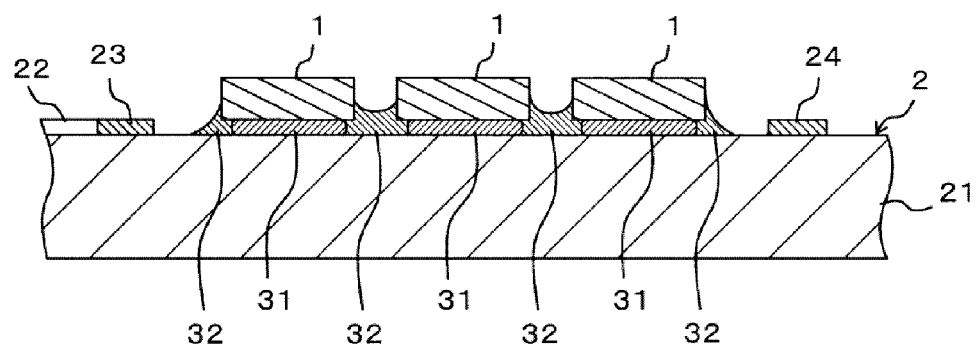
FIG. 6A is a sectional view schematically showing the second bonding material disposing step in the method for producing a light emitting device according to the embodiment.

First, in the second bonding member disposing step S104a, as shown in FIG. 6A, the second bonding member 32 in a liquid or paste form is supplied by using a dispenser, or the like, to be positioned so as to cover at least one section of the outer edges of the light emitting elements 1. The second bonding member 32 is preferably disposed to surround the entire perimeter of the outer edge of each light emitting element 1 so that the light emitting element 1 and the mounting substrate 2 are more firmly bonded together. The second bonding member 32, moreover, is preferably disposed so as to come into contact with the first bonding member 31, and surround the entire perimeter of the first bonding member 31. The second bonding member 32 may be disposed in isolation per light emitting element 1, but as shown in FIG. 6A, disposing it to fill the spaces between the light emitting elements 1 can more firmly bond the light emitting elements 1 as a whole and the mounting substrate 2 together.

Figure 7A:
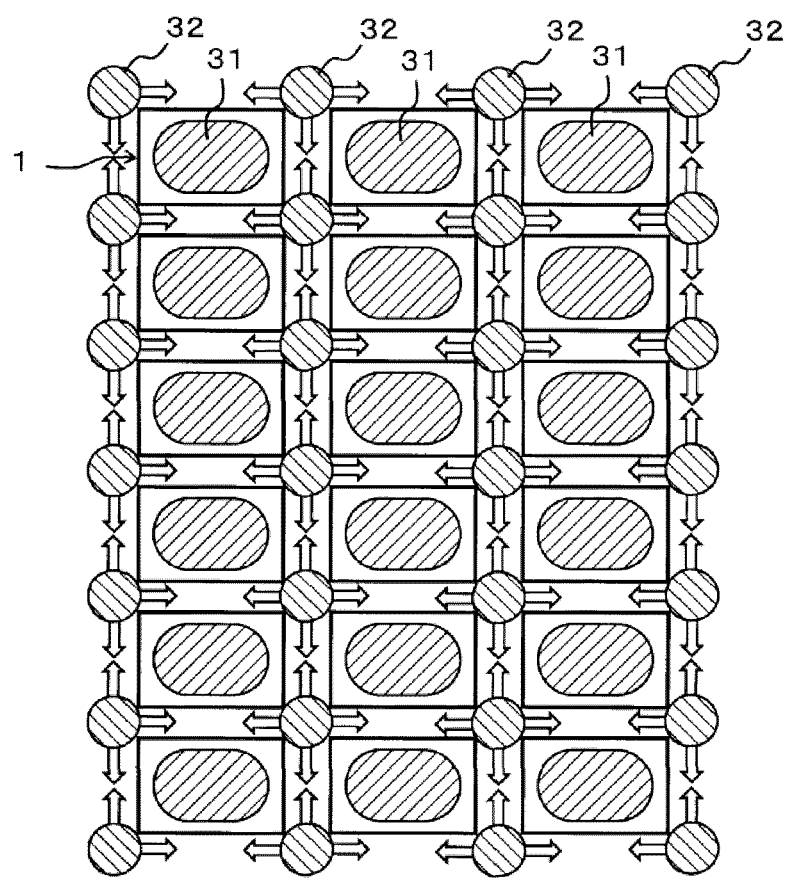
FIG. 7A is a schematic plan view showing the state immediately after dispensing the second bonding material in the second bonding material disposing step in the method for producing a light emitting device according to the embodiment.
Figure 7B:
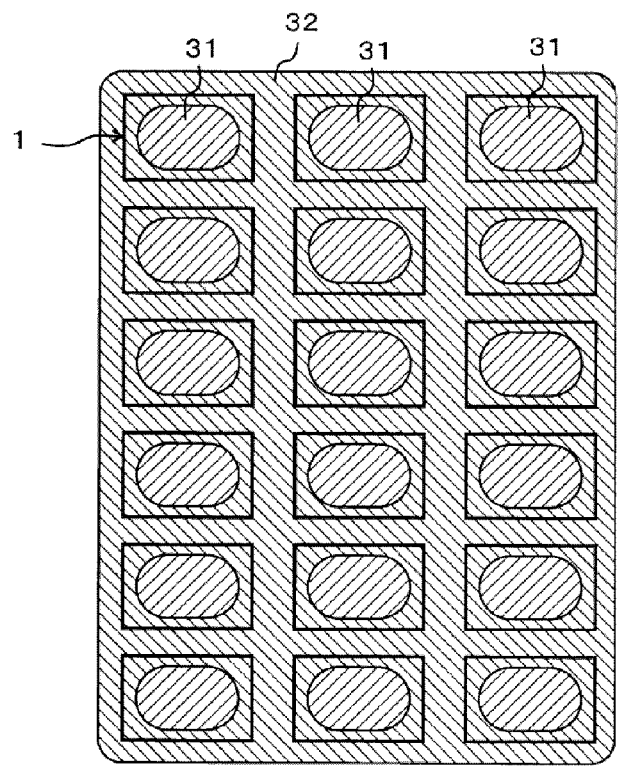
FIG. 7B is a schematic plan view showing the state in which the second bonding material has been spread in the second bonding material disposing step in the method for producing a light emitting device according to the embodiment.

In the cases where the plural light emitting elements 1 are arranged at relatively narrow intervals, such as 1 mm or less, for example, by dispensing drops of an appropriate amount of the second bonding member 32 at the corners formed by the light emitting elements 1 as shown in FIG. 7A and letting it stand, the second bonding member 32 can be disposed to surround the entire perimeter of the outer edges of the light emitting elements 1 as shown in FIG. 7B. At this time, by adjusting the viscosity of the second bonding member 32 in accordance with the intervals at which the light emitting elements 1 are arranged, the second bonding member 32 can be spread around the light emitting elements 1 and into the spaces therebetween by gravitational force and capillary action as shown in FIG. 7B.

The appropriate amount in this context refers to the amount that allows the second bonding member 32 to spread around some the light emitting elements 1, preferably the entire outer edges of the light emitting elements 1.

Furthermore, by dispensing the second bonding member 32 while placing the mounting substrate 2 on which the light emitting elements 1 are bonded by the first bonding member 31 under reduced pressure, the second bonding member 32 can efficiently penetrate the gaps between the lower faces of the light emitting elements 1 and the upper face of the mounting substrate 2 even when the gaps are narrow. This can increase the bonding strength between the light emitting elements 1 and the mounting substrate 2.

Figure 6B:
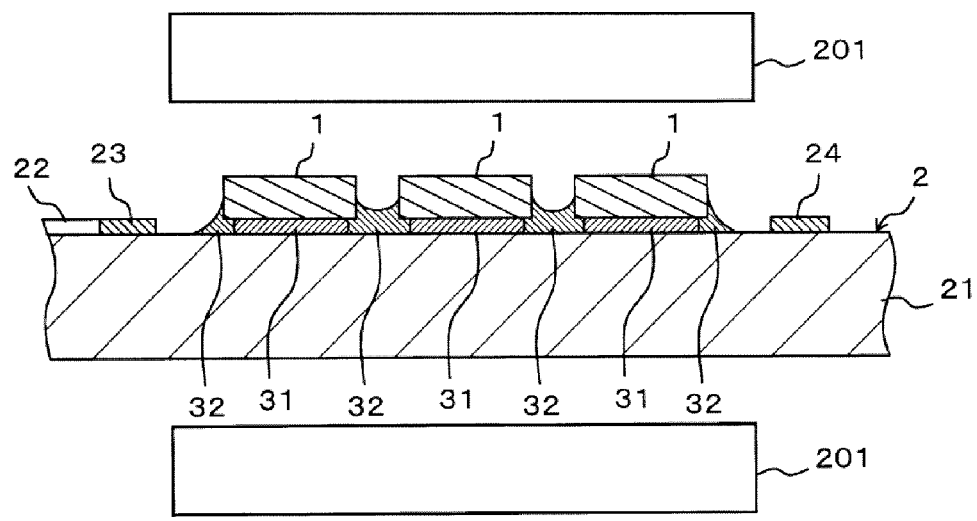
FIG. 6B is a sectional view schematically showing the second bonding material hardening step in the method for producing a light emitting device according to the embodiment.

Next, in the second bonding member hardening step S104*b*, as shown in FIG. 6B, heat treatment is performed using a heating apparatus 201 to harden the second bonding member to join the light emitting elements 1 and the mounting substrate 2 together. For the heating apparatus 201, any of those cited for the first bonding member hardening step S103*c* can be employed in accordance with the type of the second bonding member 32 and the required heating temperature for hardening. The heat treatment in the second bonding member hardening step S104*b* is performed at the temperature capable of hardening the second bonding member 32 employed, as in the case of the first bonding member hardening step S103*c*.

In the cases where the first bonding member 31 is a metal material that is melted by heat treatment, the heat treatment in the second bonding member hardening step S104*b* is preferably performed at a lower temperature than that used in the heat treatment in the first bonding member hardening step S103*c* so as not to remelt the first bonding member 31.

When the first bonding member 31 is a metal which is melted by heat treatment, as in the cases of Combination Nos. 1-3 shown in TABLE 1, a metal having a lower melting point than the metal used as the first bonding member 31 is employed as the second bonding member 32. Accordingly, the heat treatment in the second bonding member hardening step S104*b* is performed at a temperature which can melt the metal employed as the second bonding member 32, but does not melt the metal used as the first bonding member 31. This enables the first bonding member 31 to retain its bonding ability while enabling the second bonding member 32 to firmly bond the light emitting elements 1 and the mounting substrate 2 together without allowing the light emitting elements 1 to be separated or dislocated.

When the first bonding member 31 is a metal which is melted by heat treatment, as in the cases of Combination Nos. 4-9 shown in TABLE 1, a thermosetting material that can be fully cured at a lower temperature than the melting point of the metal used as the first bonding member 31 is preferably employed as the second bonding member 32. Accordingly, the heat treatment in the second bonding member hardening step S104*b* is performed at a temperature that can fully cure the thermosetting resin employed as the second bonding member 32, but does not melt the metal used as the first bonding member 31. This enables the first bonding member 31 to retain its bonding ability while enabling the second bonding member 32 to firmly bond the light emitting elements 1 and the mounting substrate 2 together without allowing the light emitting elements 1 to be separated or dislocated.

When the first bonding member 31 is a thermosetting resin or a thermosetting resin containing a metal having a relatively high melting point, as in the cases of Combination Nos. 10-13 or 14-15 shown in TABLE 1, the first bonding member 31 is not remelted by heat treatment. For this reason, the thermosetting resin employed as the second bonding member 32 may have the same curing temperature as that of the thermosetting resin used as the first bonding member 31, or higher or lower curing temperature. In these cases, moreover, the first bonding member 31 retains its bonding ability regardless of the heat treatment temperature in the second bonding member hardening step S104*b*, and thus the second bonding member 32 can firmly bond the light emitting elements 1 and the mounting substrate 2 together without allowing the light emitting elements 1 to be separated or dislocated.

In the cases where the first bonding member 31 is pre-cured in the first bonding member hardening step S103*c*, moreover, it is preferable to use a thermosetting resin as the first bonding member 31 that can be fully cured at the heating temperature used for fully curing the thermosetting material employed as the second bonding member 32 in the second bonding member hardening step S104*b*. This can fully cure both thermosetting materials employed as the first and second bonding members 31 and 32, and as a result, can more firmly bond the light emitting elements 1 and the mounting substrate 2 together.

Figure 8A:
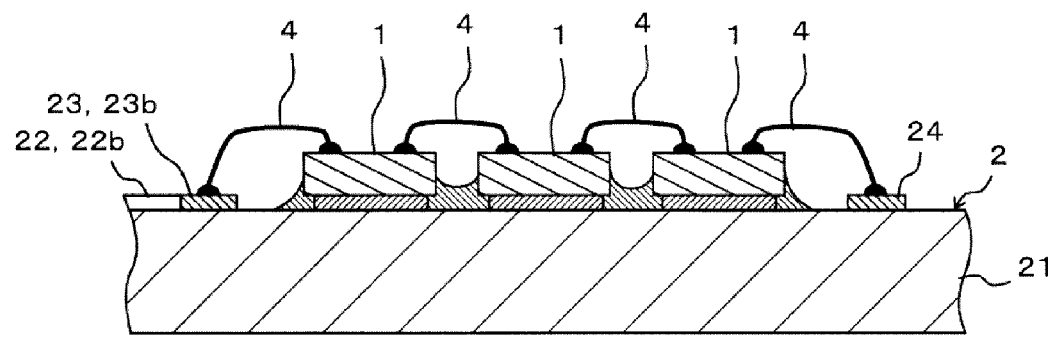
FIG. 8A is a sectional view schematically showing the wiring step in the method for producing a light emitting device according to the embodiment.

This embodiment includes a wiring step S105. As shown in FIG. 8A, this is a step of disposing wires between the wiring sections 22*b*, 23*b*, the relay wiring section 24, and the n-side electrode 13 and the p-side electrode 14 of each light emitting element 1 so as to complete the circuit described previously using a wire bonder subsequent to the second bonding step S104.

Moreover, during the wiring step S105, or before or after the wiring step S105, one of the electrodes of the protection element 5 is bonded to the wiring section 22*b* using a conductive bonding member, such as solder, and subsequently, the other electrode of the protection element 5 and the wiring section 23*b* are connected by a wire 4 using a wire bonder.

Figure 8B:
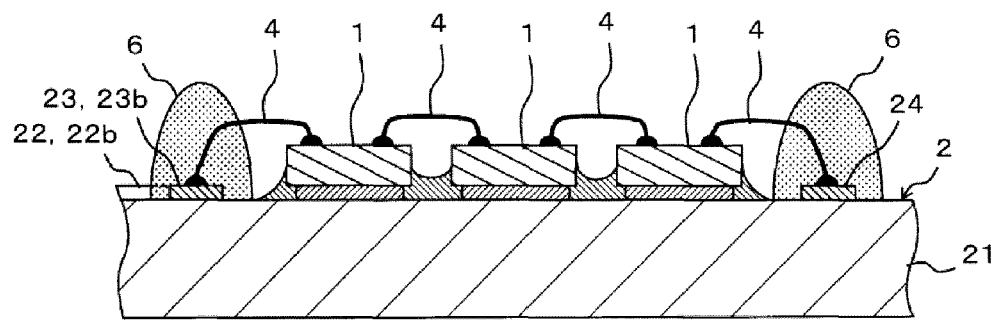
FIG. 8B is a sectional view schematically showing the light reflector forming step in the method for producing a light emitting device according to the embodiment.

This embodiment includes a light reflector forming step S106. As shown in FIG. 8B, this is a step of forming a frame-shaped light reflector 6 along the perimeter of the region in which the light emitting elements 1 are arranged on the mounting substrate 2 subsequent to the wiring step S105. The light reflector 6 is disposed to cover the wiring sections 22*b* and 23*b*, the relay wiring section 24, and some portions of the wires 4.

The light reflector 6 can be formed with any of the resin materials mentioned earlier using, for example, a dispenser. The light reflector 6 can also be formed by silk screen printing, ink-jet printing, or the like.

Figure 8C:
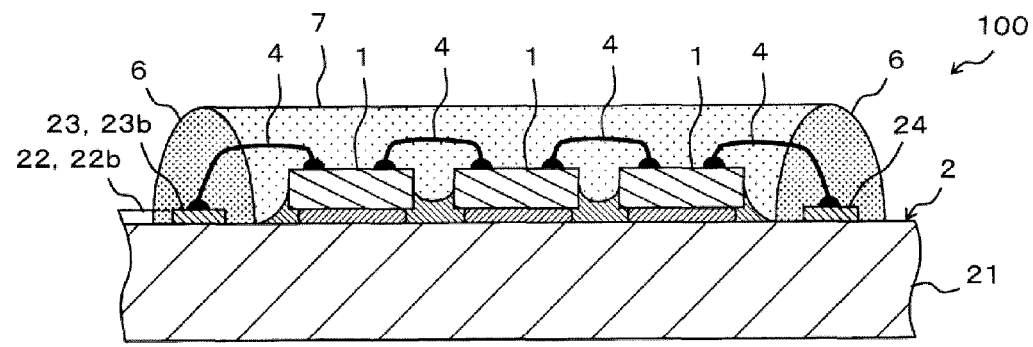
FIG. 8C is a sectional view schematically showing the sealing step in the method for producing a light emitting device according to the embodiment.

This embodiment includes a sealing step S107. As shown in FIG. 8C, this is a step of sealing the light emitting elements 1 and the wires 4 by filling the inside of the frame-shaped light reflector 6 with a sealing member 7 subsequent to the light reflector forming step S106. The sealing member 7 can be formed by dispensing any of the resin materials mentioned in the forgoing to the inner region of the light reflector 6 by potting or the like. The sealing member 7 can also be formed by molding using a die.

The light emitting device 100 in this embodiment can be produced by the steps explained above.

INDUSTRIAL APPLICABILITY

The method for producing the light emitting devices according to this disclosure are applicable to produce light emitting devices for various light sources, including liquid crystal display backlights, lighting fixtures, large sized displays, various display devices for advertisements and destination signs, image pickup devices used in digital video cameras, facsimiles, copiers, and scanners, as well as projectors.

What is claimed is:

1. A method for producing a light emitting device, the method comprising:
  a first bonding step comprising:
    disposing a first bonding member in a liquid or paste form on an upper face of a mounting substrate,
    placing a light emitting element on the mounting substrate such that the first bonding member is located between a mounting face of the light emitting element and the upper face of the mounting substrate, wherein the light emitting element includes an electrode at an upper face of the light emitting element, and
    hardening the first bonding member thereby bonding the light emitting element and the mounting substrate such that, in a plan view, an entirety of the first bonding member is contained within an area of the mounting face of the light emitting element, and
  a second bonding step comprising:
    disposing a second bonding member in a liquid or paste form on the upper face of the mounting substrate such that, in a plan view, the second bonding member is located at at least a portion of an outer edge of the mounting face of the light emitting element, and
    hardening the second bonding member.

2. The method according to claim 1, wherein the first bonding step and the second bonding step both comprise heating.

3. The method according to claim 2, wherein:
the first bonding member, before hardening, is a first paste containing particles of a first metal having a melting point at a first temperature,
the second bonding member, before hardening, is a second paste containing particles of a second metal having a melting point at a second temperature lower than the first temperature, and
in the second bonding step, hardening of the second bonding member is performed by heating at a temperature that is higher than the second temperature and lower than the first temperature.

4. The method according to claim 2 wherein:
the first bonding member, before hardening, is a paste containing particles of a metal having a melting point at a first temperature,
the second bonding member comprises a thermosetting resin, and
hardening of the second bonding member in the second bonding step is performed by heating at a temperature that is lower than the first temperature.

5. The method according to claim 2, wherein:
the first bonding member and the second bonding member each comprise a thermosetting resin, and
hardening of the first bonding member in the first bonding step and hardening of the second bonding member in the second bonding step are both performed by heating to thereby cure the thermosetting resins.

6. The method according to claim 5, wherein:
in the first bonding step, heating is performed at least at a temperature capable of pre-curing the thermosetting resin contained in the first bonding member, and
in the second bonding step, heating is performed at least at a temperature capable of fully curing the thermosetting resin contained in the second bonding member.

7. The method according to claim 5, wherein:
the first bonding member contains metal particles and a thermosetting resin, and
the thermosetting resin contained in the first bonding member is cured in the first bonding step.

8. The method according to claim 6, wherein:
the first bonding member contains metal particles and a thermosetting resin, and
the thermosetting resin contained in the first bonding member is cured in the first bonding step.

9. The method according to claim 3, wherein the first metal and the second metal are each selected from among AuSn-based and SnCu-based solders.

10. The method according to claim 4, wherein:
the metal is selected from among AuSn-based and SnCu-based solders, and
the thermosetting resin is selected from among silicone resins and epoxy resins.

11. The method according to claim 5, wherein the thermosetting resin contained in the first bonding member and the thermosetting resin contained in the second bonding member are each selected from among silicone resins and epoxy resins.

12. The method according to claim 7, wherein:
the metal is selected from among Ag and Cu, and
the thermosetting resin contained in the first bonding member and the thermosetting resin contained in the second bonding member are each selected from among silicone resins and epoxy resins.

13. The method according to claim 8, wherein:
the metal is selected from among Ag and Cu, and
the thermosetting resin contained in the first bonding member and the thermosetting resin contained in the second bonding member are each selected from among silicone resins and epoxy resins.

* * * * *